United States Patent [19]

Halbout et al.

[11] Patent Number: 4,851,767
[45] Date of Patent: Jul. 25, 1989

[54] DETACHABLE HIGH-SPEED OPTO-ELECTRONIC SAMPLING PROBE

[75] Inventors: Jean-Marc Halbout, Larchmont, N.Y.; Mark B. Ketchen, Hadley, Mass.; Paul A. Moskowitz, Yorktown Heights; Michael R. Scheuermann, Somers, both of N.Y.

[73] Assignee: International Business Machines Corporation, Armonk, N.Y.

[21] Appl. No.: 144,215

[22] Filed: Jan. 15, 1988

[51] Int. Cl.⁴ .................................. G01R 31/02
[52] U.S. Cl. .................. 324/158 P; 324/158 R; 324/158 D
[58] Field of Search .......... 324/77 K, 158 R, 158 F, 324/158 P, 158 D, 73 PC, 73 R; 357/91

[56] References Cited

U.S. PATENT DOCUMENTS

| | | | |
|---|---|---|---|
| 3,405,361 | 10/1968 | Kattner et al. | 324/158 |
| 4,021,112 | 5/1977 | Wilson | 324/158 D |
| 4,065,717 | 12/1977 | Kattner et al. | 324/158 P |
| 4,128,843 | 12/1978 | Chiang | 357/91 |
| 4,141,756 | 2/1979 | Chiang et al. | 357/91 |
| 4,218,618 | 8/1980 | Mourou | 250/211 |
| 4,301,409 | 11/1981 | Miller | 324/158 D |
| 4,417,203 | 11/1983 | Pfeiffer | 324/158 R |
| 4,446,425 | 5/1984 | Valdmanis et al. | 324/355 |
| 4,510,675 | 4/1985 | Izu | 324/158 D |
| 4,709,141 | 11/1987 | Olsen | 324/158 D |
| 4,712,057 | 12/1987 | Pau | 324/158 R |

FOREIGN PATENT DOCUMENTS 60-73366  4/1985  Japan .

Primary Examiner—Michael J. Tokar
Attorney, Agent, or Firm—John J. Goodwin

[57] ABSTRACT

A testing or sampling probe to determine the response of electrical circuits or devices to ultrafast electrical pulses. The probe is detachable from the device being tested. The probe includes a transparent substrate though which optical pulses are focused or directed onto a photoconducting gap. The probe further includes a transmission line associated with the photoconductive gap, and which terminates at a tapered end of the probe in contacts which are placed on the device under test.

7 Claims, 1 Drawing Sheet

DETACHABLE HIGH-SPEED OPTO-ELECTRONIC SAMPLING PROBE

BACKGROUND OF THE INVENTION

1. Field of the Invention

The present invention relates to apparatus for the measurement of ultrafast electrical signals, and more particularly to a measurement probe for making electrical contact for ultrafast signal measurements on, for example, an integrated circuit or device.

2. DESCRIPTION OF THE PRIOR ART

The detection of voltages at points on an integrated circuit by a probe-type measurement device is known in the art.

In U.S. Pat. No. 4,065,717, issued Dec. 27, 1977 to Kattner et al entitled Multi-point Microprobe for Testing Integrated Circuits, a multi-point probe for contacting closely spaced pads of a semiconductor device, having a flexible sheet-like member which carries the probes that make contact with the semiconductor device is described. Japanese Patent No. JA60-73366, issued Apr. 25, 1985 to Gotou entitled Apparatus for Supplying and Measuring Wiring Voltage, describes a system which makes it possible to measure the internal wiring voltages of an integrated circuit mounting printed board and to apply voltage to the internal wiring thereof by laser beam, by providing a photoconductive member and a transparent electrode to the surface wiring region of the mounting printed board. The position of internal wiring to be inspected is indicated by a focusing deflector to which X-Y position data is inputted. The focusing deflector is irradiated with a beam from a beam source and an indicated internal wiring location is irradiated with the focused deflected beam. Indicated internal wiring is irradiated with the beam through a transparent electrode and a photoconductive film. The photoconductive film comes to an equilibrium state only where the beam passes and the transparent electrode and the indicated internal wiring are brought to an equilibrium state. Then, voltage applied to the internal wiring is outputted as digital information from an A/D converter through the transparent electrode and the voltage of the internal wiring can be measured.

U.S. Pat. No. 3,405,361, issued Oct. 8, 1968 to Kattner et al entitled Fluid Actuable Multi-point Microprobe for Semiconductors, describes a system having a multi-point probe for contacting closely spaced pads of a semiconductor device having a flexible sheet-like member which carries the probes that make contact with the semiconductor device. The flexible sheet-like member forms part of a chamber, into which a fluid is introduced to deform said member to cause the probes thereon to make contact with the semiconductor device.

Other references are available which describe the measurement of high-speed pulses.

In U.S. Pat. No. 4,446,425, issued May 1, 1984 to Valdmanis et al entitled Measurement of Electrical Signals with Picosecond Resolution, electrical signals are measured (analyzed and displayed) with picosecond resolution by the electro-optic sampling of the signal being analyzed in a traveling wave Pockels cell. Sampling pulses, from an optical pulse generator such as a colliding pulse mode-locked laser, of subpicosecond duration are transmitted through the cell as polarized light and translated into a difference output corresponding to the difference in amplitude between the transmitted and rejected components of the polarized light. The signals, synchronous with the optical sampling pulses, are generated to propagate along the cell in a direction transverse to the transmission of the optical sampling pulses and in variably delayed relationship therewith. A separate beam of the optical pulses is chopped and used to activate a photoconductive device which produces the signals. The difference output is processed, preferably by a lock-in amplifier and signal averager; the lock-in amplifier is synchronized with the chopping of the launched pulses, and displayed on a time base synchronous with the variable delay of the pulses. Accordingly, the signal is displayed on an expanded time scale for measurement and other analysis. The response of photodetectors, photoconductive switches and other ultrafast light activated devices can be determined, when these devices are used as the source of the signals being analyzed and displayed.

In U.S. Pat. No. 4,218,618, issued Aug. 19, 1980 to Mourou entitled Apparatus for Switching High Voltage Pulses with Picosecond Accuracy, switching of high voltage pulses of durations from about 10 microseconds to 10 milliseconds with picosecond accuracy is accomplished by a laser activated semiconductor switch made up of a body of high resistivity semiconductor material, such as nearly intrinsic silicon, integrated into a wide band geometry, which is part of a transmission line. The high bias voltage pulses are obtained by charging the line in synchronism with the generation of the laser pulse. The high voltage bias pulse width and the length of the body is selected so as to prevent thermal breakdown of the semiconductor with such pulse widths. The energy of the laser pulse switches the high voltage to produce a multikilovolt output pulse suitable for driving devices, such as streak cameras or Pockels cells, by the same laser, which need to be synchronized with picosecond accuracy to the laser pulse. The length of the transmission line may be varied to adjust the width of the multikilovolt output pulse.

SUMMARY OF THE INVENTION

An object of the present invention is to provide a testing or sampling probe to determine the response of electrical circuits or devices to ultrafast electrical pulses.

Another object of the present invention is to provide a test probe for ultrafast signals in an integrated circuit and/or device wherein the probe is detachable from the device being tested.

A further object of the present invention is to provide a test probe that includes a transparent substrate through which optical pulses are focussed or directed onto a photoconducting gap and a transmission line associated with the photoconductive gap.

DESCRIPTION OF THE PREFERRED EMBODIMENT

Figure 1:
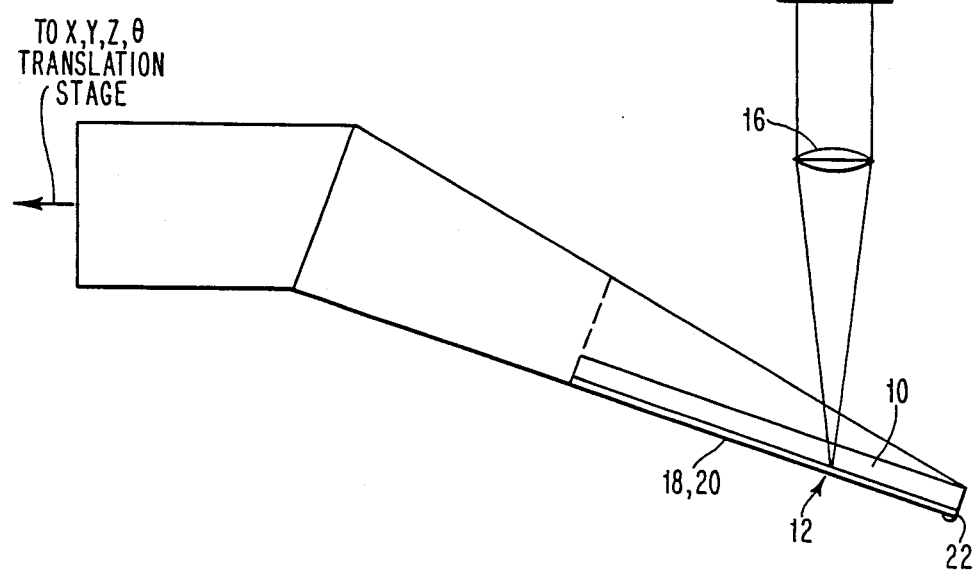
FIG. 1 is a highly schematic illustration of a cross section of the side view of one embodiment of a detachable probe for measuring high-speed pulses according to the principles of the present invention.

There is presently an interest in using opto-electronic sampling techniques to study the response of electrical devices to ultrafast electrical pulses. In the prior art, it has been shown that picosecond electrical pulses can be produced and sampled using photoconductive switches activated by short laser pulses for testing and measuring the operating characteristics of high speed electrical signals propagating within integrated semiconductor circuits. In general, it is difficult to integrate photoconductive switches on the same chip with integrated semiconductor devices or circuits. To avoid this, photoconductive switches can be fabricated on separate probes so that ultrafast electrical signals can be launched into a device or circuit from one probe and detected with another. However, a major problem in making any high speed measurement is securing a reproducible and calibrated connection from the circuit or device under test to the measurement system. The opto-electronic sampling system greatly simplifies this problem by confining the high speed portion of the signal to a relatively compact region consisting of the device, the sampling and generation site and the connecting transmission lines. No high speed signal needs to be connected to distant conventional electronics. In prior art, devices and systems, the circuit or device under test and the transmission line are connected by short wire bonds. Although wire bonds are adequate to study a small number of devices, probing a larger number of devices becomes rather awkward and time consuming. Furthermore, once a set of generating/sampling gaps are bonded to a device, it is virtually impossible to remove them without permanent damage to both the transmission lines as well as the bonding pads of the device. The present invention, however, provides a probe for measurement of high speed pulses which can easily contact and detach from the bonding pad at a circuit test site repeatedly and nondestructively. FIG. 1 illustrates a side view of the components of a novel configuration for a detachable high speed opto-electronic probe for sampling ultrafast electrical signals.

Figure 2:
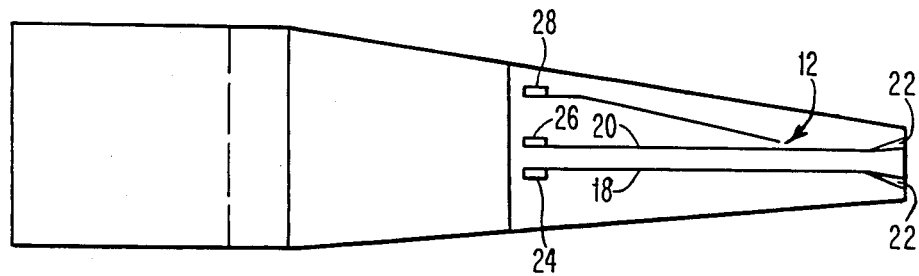
FIG. 2 is a highly schematic illustration of the bottom view of the probe embodiment of FIG. 1.

In FIG. 1, the substrate 10 of the detachable probe is transparent so light energy, such as laser pulses, pass through the substrate 10 from the top and illuminate a photoconductive gap 12 on the bottom of the probe. Optical pulses from a light source, such as laser 14, can be focused onto the photoconducting gap 12 in the probe with a lens 16 above the substrate 10. Alternatively, an optical fiber could be used to guide light onto the gap. A typical metallization pattern which is fabricated on the bottom of the substrate is shown in FIG. 2. The center conductors 18 and 20 form a transmission line of uniform impedance which are tapered out at one end (shown at the right end of FIG. 1) to match the bonding pads of the circuit or device being tested. The transmission lines 18 and 20 carry high speed signals to the circuit being tested from the photoconductive generating gap 12 and from the circuit under test back to the photoconductive sampling gap 12. At the tapered end, contacts 22 composed of gold or gold alloy are deposited on top of the expanded regions to make contact. These are the only high speed contacts in the system and may be fabricated using a variety of techniques such as electroplating, thermocompression bonding or laser deposition. Because these contacts would be substantially shorter than the wire bonds discussed earlier, a much smaller inductive discontinuity is possible between the circuit being tested and the transmission lines 18,20. Because this system relies on sampling the high speed electrical signal, all other connections, such as contacts 24, 26 and 28, are either low speed or DC, so wire bonded connections thereto are adequate. In practice, the probe can be supported by a PC board which, in turn, is mounted on an arm of a x,y,z,$\theta$ translation stage (not shown) so that the probe can be accurately positioned and placed on the pads of a test site.

A number of material and geometrical embodiments may be used. Substrates composed of silicon on sapphire or quartz are transparent in the visible and highly insulating and may be used in the test probe. Silicon substrates which are transparent in the infrared could also be used. The detachable probes of the present invention can operate using electro-optic sampling techniques as well as opto-electronic. In such applications, the electrical signal to be sampled is launched from the circuit under test to a probe embodiment made of an electro-optic material such as $LiNbO_3$. A delayed portion of the generating optical pulse is passed through the electro-optic material in the vicinity of the electrical signal. The polarization of the optical pulse is changed by the electric fields of the electric signal. This probe could have the same geometry as the opto-electonic embodiment of FIGS. 1 and 2. Typically, these probes would be used in pairs. The opto-electronic probe would be used to generate a high speed input signal. The output signal would be sampled with a second probe either opto-electronic or electro-optic. However, if the circuit under test is driven synchronously with the laser source, only one sampling probe would be needed.

Having thus described our invention, what we claim as new, and desire to secure by Letters Patent is:

1. Electrical signal sampling probe apparatus responsive to electrical signals at selected points in an electrical circuit comprising:
   a transparent substrate,
   electrically conductive signal transmission means disposed on said transparent substrate, said electrically conductive signal transmission means extending to the one end of said substrate,
   electrical contacts connected to said electrically conductive signal transmission means at said end of said transparent substrate,
   an electrical signal conductive line disposed on said substrate and separated from said electrically conductive signal transmission means by a photoconductive radiant energy responsive conductive gap,
   a source of a radiant energy beam,
   means for directing said radiant energy beam from said source onto said photoconductive radiant energy responsive conductive gap to electrically connect said conductive line to said signal transmission means through said gap, said substrate being adapted to place said electrical contacts onto elected points on an electrical circuit, whereby electrical signals from said selected points of said electrical circuit are transmitted through said electrical contacts, said transmission means and through said conductive gap to said electrical signal conductive line.

2. An electrical signal sampling probe apparatus according to claim 1 wherein said source of a radiant energy beam is a source of a light frequency photo beam.

3. An electrical signal sampling probe according to claim 2 wherein said substrate is radiant energy transparent and said light frequency beam is directed through said substrate into said gap.

4. An electrical signal sampling probe apparatus according to claim 2 wherein said source of light frequency photo beam is a laser apparatus.

5. An electrical signal sampling probe apparatus according to claim 3 wherein said substrate is composed of silicon disposed on sapphire.

6. An electrical signal sampling probe apparatus according to claim 3 wherein said substrate is composed of silicon disposed on quartz.

7. An electrical signal sampling probe apparatus according to claim 3 wherein said substrate is composed of infrared radiation transparent silicon.

* * * * *